(12) United States Patent
Krishnan et al.

(10) Patent No.: US 8,951,846 B2
(45) Date of Patent: Feb. 10, 2015

(54) CONTROLLING THERMAL INTERFACE MATERIAL BLEED OUT

(75) Inventors: Gopi Krishnan, Chandler, AZ (US); Mingjie Xu, Chandler, AZ (US); Edvin Cetegen, Chandler, AZ (US); Sung-Won Moon, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/991,900

(22) PCT Filed: May 31, 2012

(86) PCT No.: PCT/US2012/040316
§ 371 (c)(1),
(2), (4) Date: Jun. 5, 2013

(87) PCT Pub. No.: WO2013/180726
PCT Pub. Date: Dec. 5, 2013

(65) Prior Publication Data
US 2014/0027899 A1    Jan. 30, 2014

(51) Int. Cl.
*H01L 21/44* (2006.01)
*H01L 21/48* (2006.01)
*H01L 21/50* (2006.01)
*H01L 23/34* (2006.01)
*H01L 23/373* (2006.01)
*H01L 23/42* (2006.01)

(52) U.S. Cl.
CPC ............ *H01L 23/34* (2013.01); *H01L 23/3737* (2013.01); *H01L 23/42* (2013.01); *H01L 2924/0002* (2013.01)
USPC .................... 438/122; 257/712; 257/E21.525

(58) Field of Classification Search
CPC ...................................... H01L 23/34
USPC ............................ 257/712, E21.525; 438/122
See application file for complete search history.

(56) References Cited

U.S. PATENT DOCUMENTS

| | | |
|---|---|---|
| 2004/0188814 A1 | 9/2004 | Houle et al. |
| 2006/0180926 A1* | 8/2006 | Mullen et al. ............... 257/727 |
| 2008/0191729 A1 | 8/2008 | Blanco et al. |
| 2009/0179322 A1 | 7/2009 | Furman et al. |
| 2009/0302459 A1 | 12/2009 | Chainer |

OTHER PUBLICATIONS

PCT International Search Report and Written Opinion for PCT/US2012/040316, mailed Feb. 1, 2013 (11 pp.).

* cited by examiner

*Primary Examiner* — David S Blum
(74) *Attorney, Agent, or Firm* — Blakely, Sokoloff, Taylor & Zafman LLP

(57) ABSTRACT

An extended preform of a thermal interface material (TIM) is formed between a heat spreader and a die on a substrate. The preform has an extension beyond a footprint of the die. The preform is cured. A bleed out of the TIM is controlled by the extension upon curing of the preform.

21 Claims, 12 Drawing Sheets

CONTROLLING THERMAL INTERFACE MATERIAL BLEED OUT

CROSS-REFERENCE TO RELATED APPLICATIONS

This patent application is a U.S. National Phase application under 35 U.S.C. §371 of International Application No. PCT/US2012/040316, filed May 31, 2012, entitled "CONTROLLING THERMAL INTERFACE MATERIAL BLEED OUT".

TECHNICAL FIELD

Embodiments as described herein relate to the field of electronic systems manufacturing, and in particular, to an electronic system assembly.

BACKGROUND ART

Generally, thermal interfacial materials (TIMs) are thermally conductive materials, which are applied across jointed solid surfaces, for example, between a device and a heat sink to increase thermal transfer efficiency. For integrated circuit packages, the TIM materials typically are applied between an integrated circuit device (e.g., a die) and an integrated heat spreader to lower package thermal resistance.

FIG. 1 is a cross-sectional view 100 of a typical electronic device structure having a solder TIM 101 applied between a die 102 and an integrated heat spreader 103. As shown in FIG. 1, die 102 is on a substrate 106. Die side components (DSCs), such as a DSC 107 are on substrate 106. At present, in the products that use the solder TIM between the die and the integrated heat spreader (IHS) to dissipate heat generated by electronic devices, regions of excessive solder bleed out surpassing the footprint of the die (when an inner sealant bead is not used) are spontaneously formed during curing of the TIM. As shown in FIG. 1, the bleed out regions of the TIM 101, such as a bleed out region 104 and a bleed out region 105 are formed during curing of the TIM spontaneously. As shown in FIG. 1, the bleed out regions 104 and 105 extend beyond the footprint of the die towards the DSCs on the substrate 106, such as a DSC 107. As shown in FIG. 1, bleed out region 104 touches DSC 107. At present, the solder bleed out is not controlled. Uncontrollable solder bleed out increases possibility of the TIM touching the DSCs on a substrate causing the device shortages and the consequent associated device failures. As the distance between the die and DSC decreases, the chances of touching the device components by the uncontrolled solder bleed out increase leading to more device failures.

DESCRIPTION OF THE EMBODIMENTS

Figure 1A:
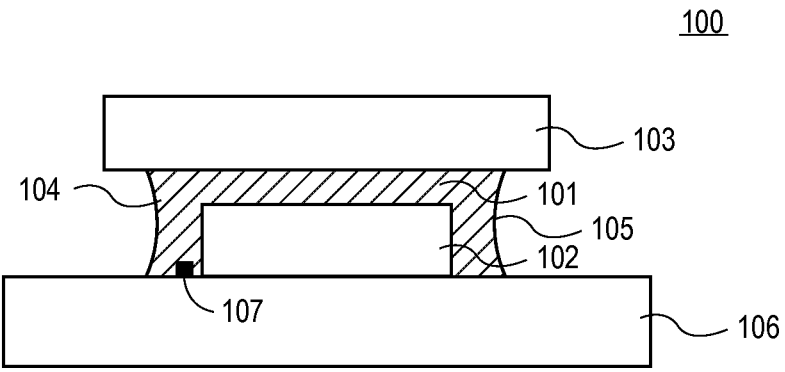
FIG. 1 is a cross-sectional view of a typical electronic device structure having a solder TIM applied between a die and an integrated heat spreader.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessarily obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration within the scope of the appended claims. The description is thus to be regarded as illustrative rather than limiting.

With a trend of moving towards reducing the distance between the die and die side components ("DSC"), control the bleed out of the thermal interface material ("TIM") is imperative to avoid device failures. Embodiments described herein provide methods and apparatuses to control and modulate thermal interface material ("TIM") bleed out. Currently, an inner sealant bead that encapsulates the DSC is used to isolate the DSC from the solder TIM ("STIM") bleed out. The cured sealant bead physically serves as an insulating barrier to a STIM bleed out. However, encapsulating the DSC into the inner sealant bead requires an additional processing operation during assembly that reduces the assembly throughput dramatically. Additionally, encapsulating the DSC into the inner sealant bead uses an additional equipment that dispenses the insulating material onto the DSC that significantly increases the cost of manufacturing of the electronic package. Additionally, inner sealant bead introduces a potential hot spot for the electronic package that negatively impacts the reliability and performance of the electronic device.

Methods and apparatuses to provide extended preforms to control TIM bleed out upon assembly described herein use an inherent geometric adaptation to the TIM preform to control the TIM bleed out direction. Embodiments described herein replace the current preform that is sized to match the die footprint by a preform larger in a predetermined direction. In at least one embodiment, an extended preform of a thermal interface material (TIM) is formed between a heat spreader and a die on a substrate. The preform has an extension beyond a footprint of the die. A bleed out of the TIM is controlled by the extension upon curing of the preform, as described in further detail below.

Figure 2:
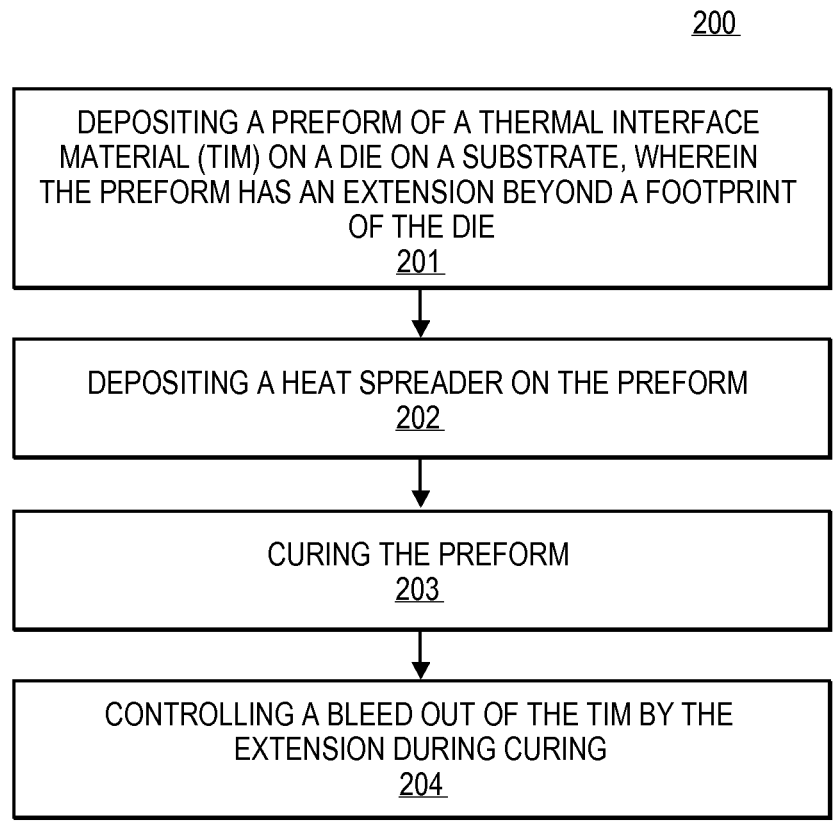
FIG. 2 shows a flowchart of a method to manufacture an integrated circuit device according to one embodiment of the invention.

FIG. 2 shows a flowchart of a method 200 to manufacture an integrated circuit device according to one embodiment of the invention. At operation 201, a TIM preform is deposited on a die on a substrate. Generally, a preform is a TIM having a predetermined shape specifically designed for an application to be used.

Figure 3A:
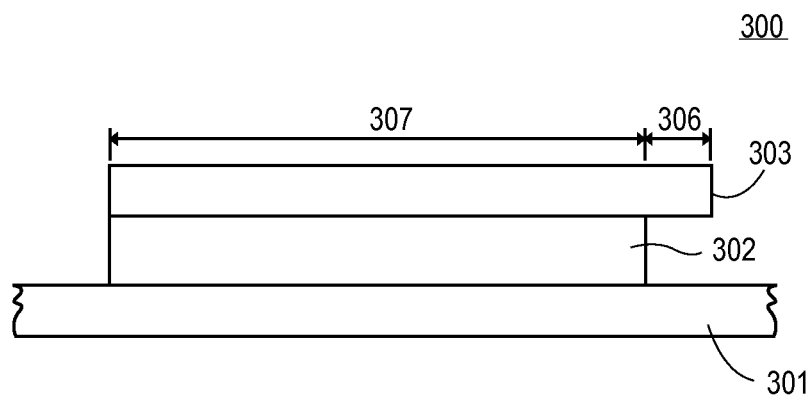
FIG. 3A shows a cross-sectional view of an electronic device package structure having an extended TIM preform according to one embodiment of the invention.

FIG. 3A shows a cross-sectional view of an electronic device package structure 300 having an extended TIM preform according to one embodiment of the invention. As shown in FIG. 3A, structure 300 includes an extended preform of the TIM 303 deposited on a die 302 on a substrate 301. Generally, a die in the context of integrated circuits is a small block of semiconducting material, on which a functional circuit is fabricated. Typically, integrated circuits are produced on a wafer of electronic-grade silicon or other semiconductor (for example, Gallium Arsenide ("GaAs") using one of photolithography techniques known to one of ordinary skill in the art of electronic device manufacturing.

The wafer is typically cut ("diced") into many pieces, each containing a copy of the circuit. Each of these pieces is called a die. In at least some embodiments, die 302 can comprise stacked electronic components, non-stacked electronic components, or a combination thereof. In at least some embodiments, die 302 can be, for example, a microprocessor, a memory, any of other stacked and non-stacked electronic components, or a combination thereof. Die 302 can be mounted on substrate 301, for example, using a wirebonding, a flip-chip connection, and any other technique known to one of ordinary skill in the art of electronic device manufacturing. The die can be directly attached to the substrate using one of technique known to one of ordinary skill in the art of device manufacturing. In one embodiment, the substrate 301 is a laminated substrate at a bottom side of an electronic device package. The substrate 301 can have conductive traces that route and connect, for example, the die-to-substrate bonds to the substrate-to-ball array bonds. In one embodiment, substrate 301 includes an organic core, resin, filler material, copper, solder epoxy underfill, solder, or a combination thereof. In one embodiment, substrate 301 includes die side components ("DSC"). Die side components can be for example, any one of active and passive electronic device components, such as transistors, memories, capacitors, resistors, optoelectronic devices, switches, interconnects, and any other electronic device components. In at least some embodiments, substrate 301 is a ceramic substrate.

In one embodiment, substrate 301 includes a semiconductor material, e.g., monocrystalline silicon ("Si"), germanium ("Ge"), silicon germanium ("SiGe"), a III-V material such as gallium arsenide ("GaAs"), or any combination thereof. In one embodiment, substrate 301 includes metallization interconnect layers for integrated circuits. In at least some embodiments, substrate 301 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 301 includes interconnects, for example, vias, configured to connect the metallization layers.

As shown in FIG. 3A, extended TIM preform 303 has an extension 306 beyond a footprint 307 of the die 302. The extension 306 is configured to control a bleed out of the TIM upon curing of the preform. The TIMs typically refer to the high thermal conductivity materials that become liquidous or near-liquidous at predetermined operating temperatures, for example metal based TIMs, polymeric based TIMs. The TIMs can flow and fill surface asperities enabling reductions in thermal resistance between two contacting surfaces.

The TIM preform 303 can be, for example, a metallic alloy with a low melting point. The TIM preform can be, for example, a solder thermal interface material ("STIM") used for example, for power, RF, and integrated circuit packages. The solder thermal interface materials are known to one of ordinary skill in the art of electronic device manufacturing. The solder preform may include the solder flux needed for the soldering process. In at least some embodiments, the extended preform is a STIM preform.

In one embodiment, the TIM preform is a metal based TIM. In one embodiment, the TIM preform is a metal based alloy, including, for example, Indium (In), tin (Sn), lead (Pb), silver (Ag), antimony (Sb), Bismuth (Bi), zinc (Zn), Cadmium (Cd), gold (Au), copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), platinum Pt, or any combination thereof. In at least some embodiments, the thickness of the extended TIM preform is from about 0.05 mm to about 0.45 mm, and more specifically, from about 0.07 mm to about 0.41 mm. In one embodiment, the STIM has indium. In one embodiment, the STIM is 99.99% indium solder.

The metal based TIM are known to one of ordinary skill in the art of electronic device manufacturing. In at least one embodiment, the TIM preform is a STIM1 preform that is deposited between the die and a lid of an electronic device package to lower an electronic device package thermal resistance. The TIM preform can be manufactured using one of techniques known to one of ordinary skill in the art of electronic device manufacturing, for example, by stamping. In one embodiment, the extended preform as described herein is prefabricated by a preform supplier using the same technique as the technique used to fabricate non-extended performs, such as stamping.

The solder preform may include the solder flux needed for the soldering process. This can be an internal flux, inside the solder preform, or external, with the solder preform coated. In at least some embodiments, the extended preform is fabricated through the same supplier stamping process, as manufacturing the non-extended preform. In one embodiment, the extended TIM preform is placed on the die using a vacuum tool known to one of ordinary skill in the art of electronic device manufacturing. In one embodiment, the preform pick up tool position is adjusted according to the size of preform extension, and the measurement tool position is adjusted according to the size of the preform extension for accurate placement of the preform on the die.

Figure 4:
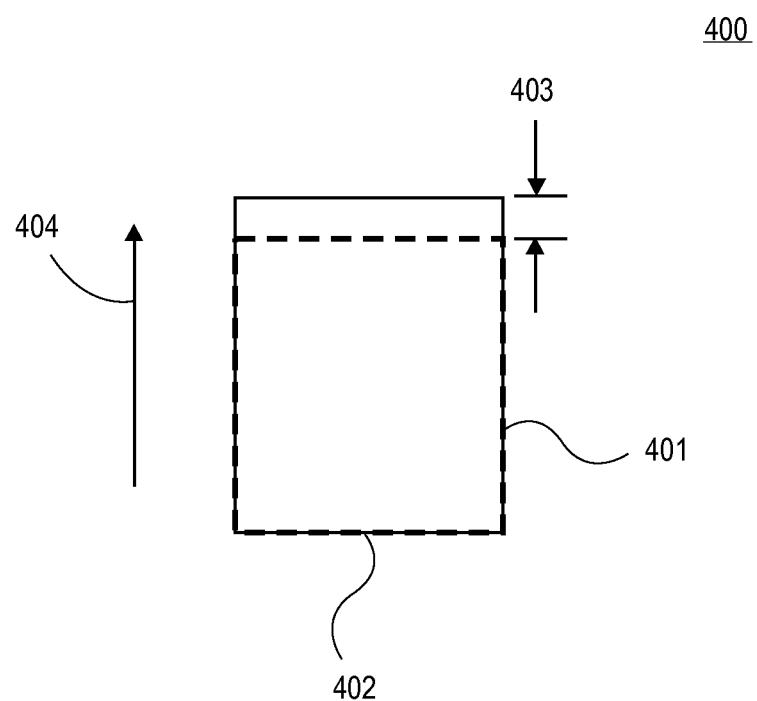
FIG. 4 shows a schematic of an extended preform concept according to one embodiment of the invention.

FIG. 4 shows a schematic of an extended preform concept according to one embodiment of the invention. As shown in FIG. 4, an extended preform of the TIM 402 to be placed on a die and cured at an assembly process is formed. TIM preform 402 has an extension beyond a footprint of the die 401 in a predetermined direction to control a bleed out direction of the TIM upon curing the preform. As shown in FIG. 4, TIM preform 402 is extended at a distance beyond a die footprint 401 in the direction one wishes the TIM bleed out to occur. In at least some embodiments, a direction of the preform extension controls a direction of the bleed out. For example, if the preform is extended in a direction 402, the TIM bleed out upon curing the preform occurs in direction 402. In at least some embodiments, the die has a rectangular footprint, and the TIM preform is extended along a shorter side of the rectangular footprint. In at least some embodiments, the size of the preform extension, such as a size 403 controls a size of the bleed out. In one embodiment, the size of the bleed out is about the size of the extension. For example, if the size of the extension is about 1 mm, the size of the bleed out is about 1 mm. In at least some embodiments, the size of the extension is at least 10% of the die footprint size. For example, if the die footprint is about 20 mm×30 mm, the size of the extended preform can be about 22 mm×30 mm, or about 23 mm×30 mm. In at least some embodiments, the extension size is greater than 1 millimeter (mm) In at least some embodiments, the extended preform induces a force to control the bleed out. That is, the extended preform is larger than the die footprint in the desired direction of the bleed out. In contrast, the non-extended existing performs have the size that is equal to the die footprint size. The extended preform directs the bleed out front by leveraging the inherent pressure gradient induced by the differential curvatures of the TIM melt. The extension serves to induce a pressure gradient caused by the differences in the solder melt curvature, which results in a force directed towards the extension.

Figure 3B:
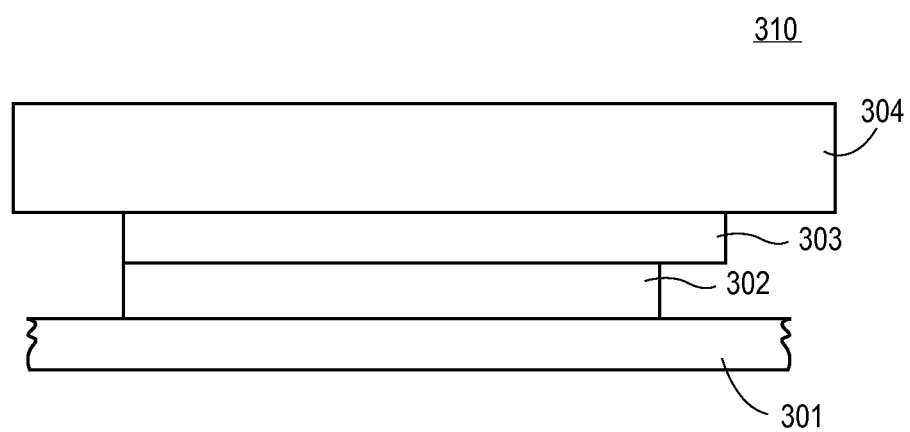
FIG. 3B shows a view similar to FIG. 3A after a lid is deposited onto the extended TIM preform according to one embodiment of the invention.

Referring back to FIG. 2, method 200 continues with an operation 202 that involves depositing a heat spreader on the preform. FIG. 3B shows a view 310 similar to FIG. 3A after a lid 304 is deposited onto the extended TIM preform 303 according to one embodiment of the invention. In at least some embodiments, the lid acts as an integrated heat spreader on the extended preform. The lid can be deposited onto the extended preform using one of techniques known to one of ordinary skill in the art of electronic device manufacturing. In at least some embodiments, the lid 304 is attached via a TIM2 to a heat sink (not shown) to lower overall package to case thermal resistance. In at least some embodiments, lid 304 contains a conductive material, such as copper, aluminum, nickel, any other metal, a metal alloy, any other conductive material, or a combination thereof to conduct heat away from the die. In one embodiment, lid 304 acting as an integrated heat spreader is made of copper, aluminum, or any other high thermal conductivity material. The integrated heat spreaders are known to one of ordinary skill in the art of electronic device manufacturing.

Referring back to FIG. 2, method 200 continues with an operation 203 that involves curing the extended preform. In at least some embodiments, the extended preform is cured in an oven at a temperature from about 150° C. to about 180° C. for about 50-60 minutes using one of the TIM curing techniques known to one of ordinary skill in the art of electronic device manufacturing. At operation 204 a direction and size of the TIM bleed out occurring upon the TIM preform curing is controlled by the extension. In at least some embodiments, a direction of the bleed out is controlled by adjusting a direction of the extension. In at least some embodiments, a size of the bleed out is controlled by adjusting a size of the preform extension. In at least some embodiments, the preform extension induces a force to control the bleed out. In at least some embodiments, the size of the TIM preform extension is the parameter that most influences the efficacy of the bleed out control technique and is designed in accordance to the characteristics of the electronic device package.

Figure 3C:
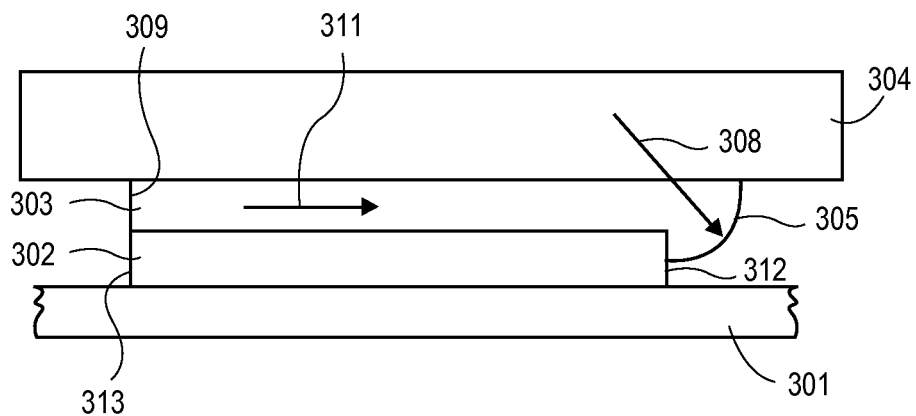
FIG. 3C shows a view similar to FIG. 3B after curing of the extended preform according to one embodiment of the invention.

FIG. 3C shows a view 320 similar to FIG. 3B after curing of the extended preform according to one embodiment of the invention. As shown in FIG. 3C, a TIM bleed out 305 is formed during curing that is controlled by the extension of the preform 303. The extended preform 303 directs the bleed out front 305 by leveraging the inherent pressure gradient induced by the differential curvatures in the solder melt. The pressure gradient across a fluid interface is inversely proportional to the radii of curvature. During the cure process the solder preform melts, resulting in a curvature in the fluid at the preform edges. As shown in FIG. 3C, a radius of curvature 308 at an extended edge of the preform 304 is substantially greater than a radius of curvature at a non-extended edge 309. The difference in curvature radii at the opposite edges of the extended preform induces a pressure gradient that results in a driving force in a direction 311 of the greater radius of curvature that forms bleed out 305.

Figure 3D:
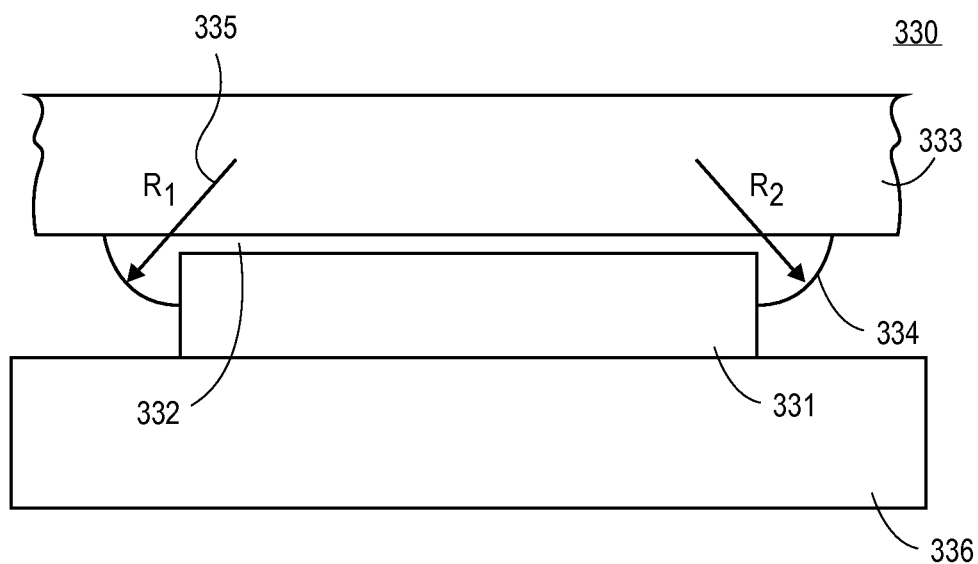
FIG. 3D shows a cross-sectional view of an electronic device package structure having non-extended preform after curing according to one embodiment of the invention.

FIG. 3D shows a cross-sectional view of an electronic device package structure 330 having non-extended preform after curing according to one embodiment of the invention. As shown in FIG. 3D, a non-extended TIM preform 332 is applied between a die 331 on a substrate 336 and a lid 333. The lid, substrate, die, and TIM can be similar to those described above. As shown in FIG. 3D a radius of curvature of the TIM melt at one side 334 is substantially the same as a radius of curvature of the STIM melt at an opposite side 335. As shown in FIG. 3D, the equal radii of curvature, such as radii of curvature 335 and 334 do not induce a force along the TIM preform 331, and a TIM bleed out is not controlled.

Referring back to FIG. 3C, a force, such as the force along direction 311 can be induced by increasing the amount of the STIM at one edge of the preform, e.g., an edge 312 while leaving the amount of the STIM at an opposite edge, e.g., an edge 313 intact. That is, the difference in the amount of the STIM at the opposite edges of the preform, e.g., edges 312 and 313 provides a differential radius of curvature during the cure process resulting in an additional force directed towards the side of the increased STIM volume, e.g., edge 312. In at least one embodiment, this force is used to control the post cure STIM parameters (e.g., uniformity, bleed out direction, and bleed out size).

Figure 11:
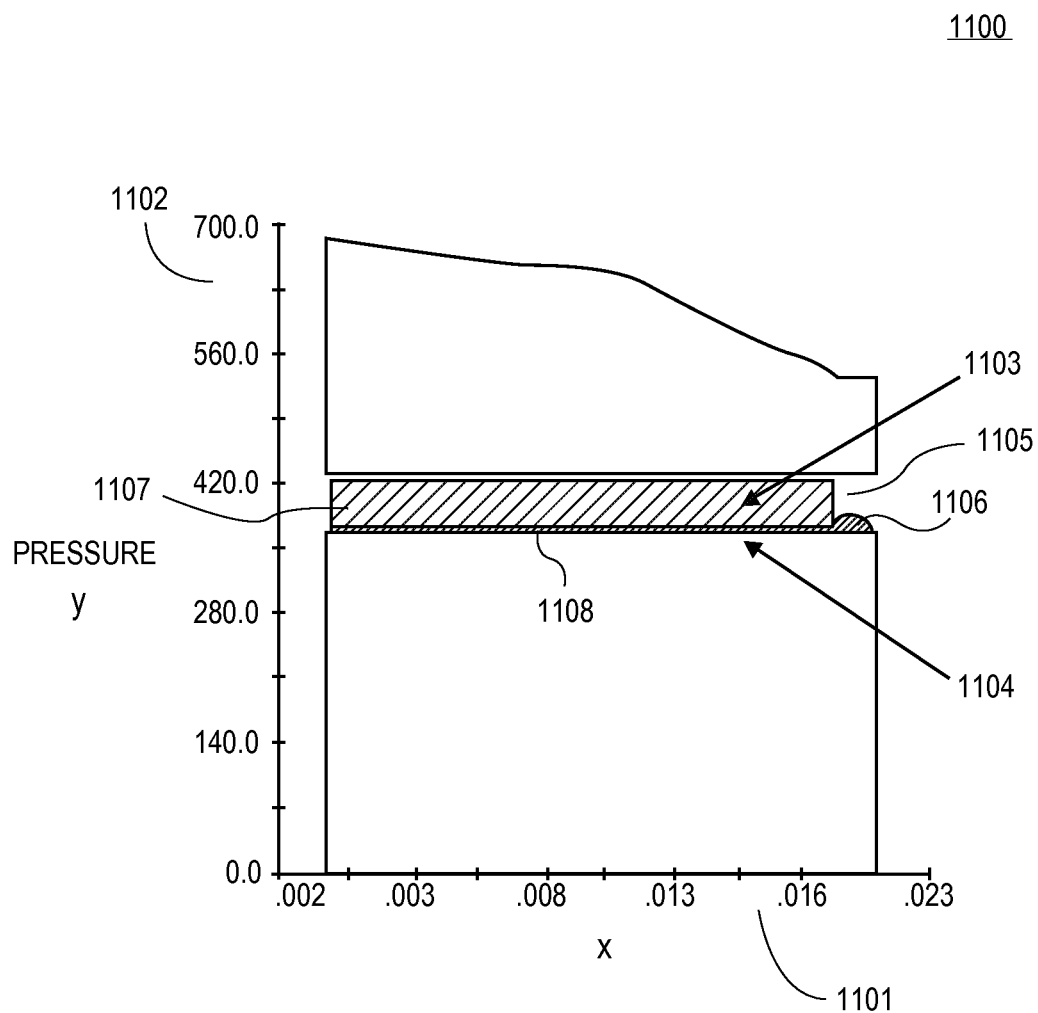
FIG. 11 shows a graph illustrating distribution of the pressure across the solder melt of the extended preform at a curing process according one embodiment of the invention.

FIG. 11 shows a graph 1100 illustrating distribution of the pressure across the solder melt of the extended preform at a curing process according one embodiment. Graph 1100 displays a pressure 1102 (at axis y) as a function of a distance along a preform 1101 (at axis x). FIG. 11 also shows an exemplary cross-sectional view of an electronic device package structure 1105 having a STIM preform 1108 placed between a die 1103 and an integrated heat spreader 1104. As shown in FIG. 11, a pressure at a non-extended side 1107 of the preform is greater than a pressure at an extended side 1106 of the preform. The difference in the curvatures at opposite sides of the STIM preform melt produces a pressure gradient towards the extended side of the preform, as shown in FIG. 11. In one embodiment, a 2D computational fluid dynamics (CFD) model is used to demonstrate the curvature induced pressure gradient, where the extended side of the preform has a lower pressure than the non-extended side of the preform.

Figure 5:
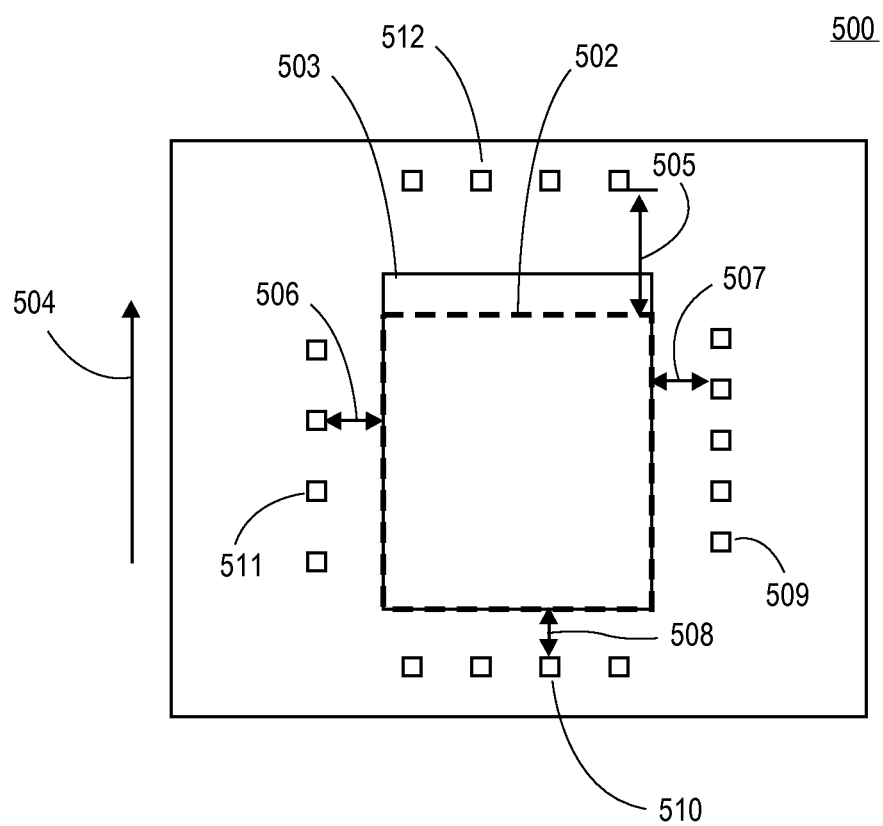
FIG. 5 shows a top view of an electronic device package structure according to one embodiment of the invention.

FIG. 5 shows a top view of an electronic device package structure 500 according to one embodiment of the invention. Electronic device package structure 500 has an extended TIM preform 503 deposited on a die 502 on a substrate 501, as described herein. As shown in FIG. 5, TIM preform 503 has an extension extending beyond a footprint of die 502 (shown by a dashed line) in a direction 504. As shown in FIG. 5, die side components (DSCs), such as die side components 509, 510, 511, and 512 are formed on substrate 501, as described above. In one embodiment, wherein a direction of the extension (such as direction 504) is determined by a keep out zone ("KOZ") between the die and DSCs on the substrate. Controlling the TIM bleed out by extending the TIM preform in a predetermined direction is particularly advantageous if the die-to-DSC KOZ at one edge of the die is greater than the die-to-DSC KOZ at the other edges of the die, allowing to clearly extend the preform in the large KOZ direction.

As shown in FIG. 5, the die-to-DSC keep out zone ("KOZ") 505 is greater than other die-to-DSC KOZs, such as KOZs 506, 507, and 508. The preform 503 is extended towards the largest KOZ 505, as shown in FIG. 5. Controlling the TIM bleed out by extending the TIM preform in a predetermined direction can be applied to products with equal KOZ's as long as the KOZ is greater than the size of the extension.

Figure 6:
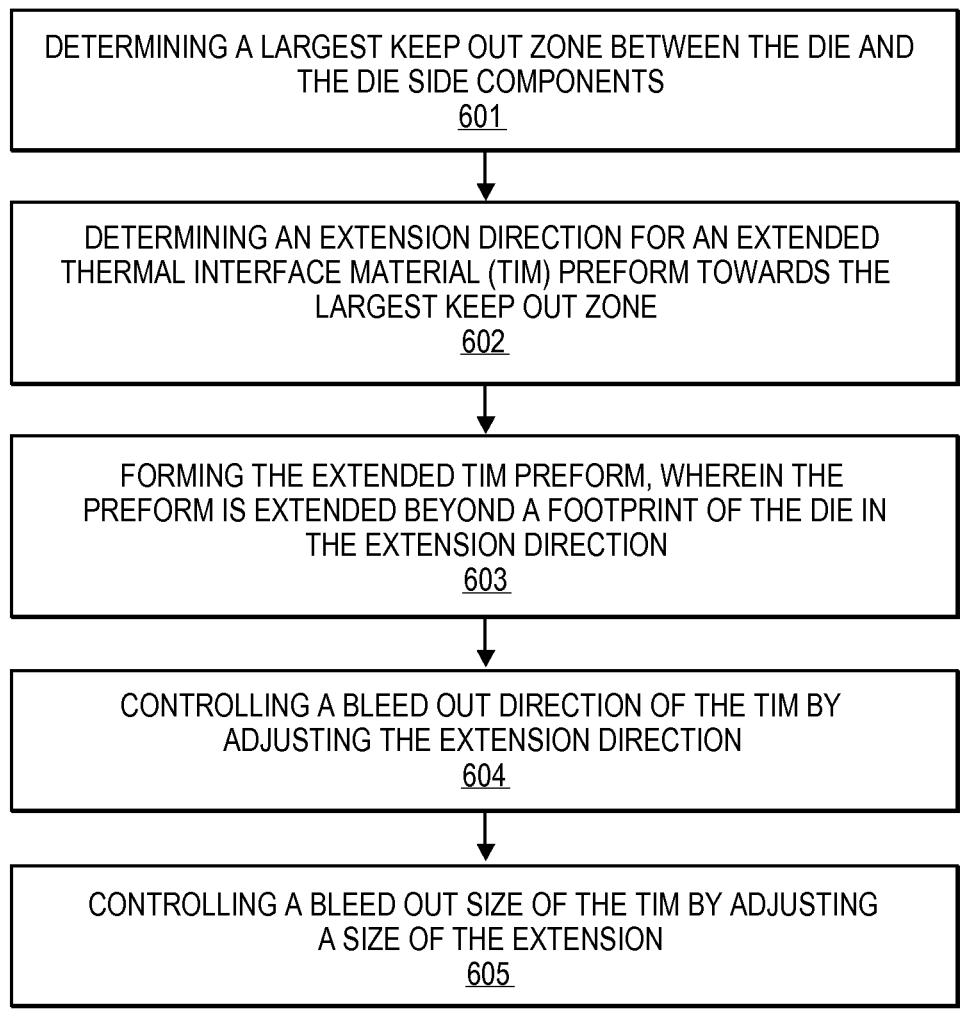
FIG. 6 shows a flowchart of a method to manufacture an integrated circuit device according to one embodiment of the invention.

FIG. 6 shows a flowchart of a method 600 to manufacture an integrated circuit device according to one embodiment of the invention. Method 600 begins with an operation 601 that involves determining a largest keep out zone ("KOZ") between a die footprint and die side components on a substrate, as described above. At operation 602 an extension direction for an extended TIM preform towards the largest KOZ is determined, as described above. At operation 603 an extended preform is formed on a die on a substrate. The extended preform is extended beyond a footprint of the die in a predetermined extension direction, as described above. At operation 604 a bleed out direction of the TIM is controlled by adjusting the extension direction, as described above. At operation 605, a bleed out size of the TIM is controlled by adjusting a size of the preform extension, as described above. To validate the theory and numerical modeling, units were built on the assembly floor using the extended preform as described herein.

Figure 7:
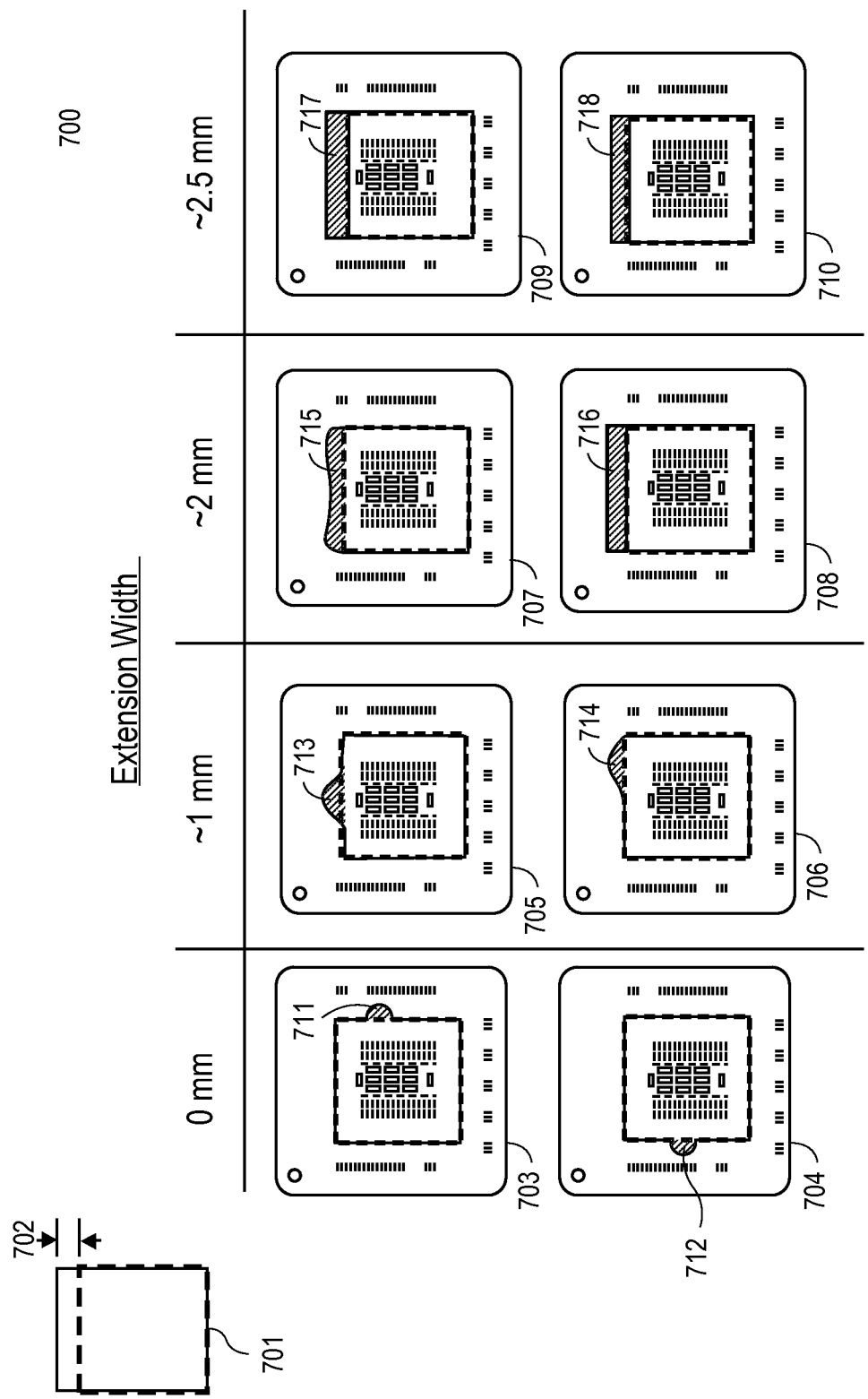
FIG. 7 shows exemplary X-ray images of the electronic device packaging units after curing according one embodiment of the invention.
Figure 8:
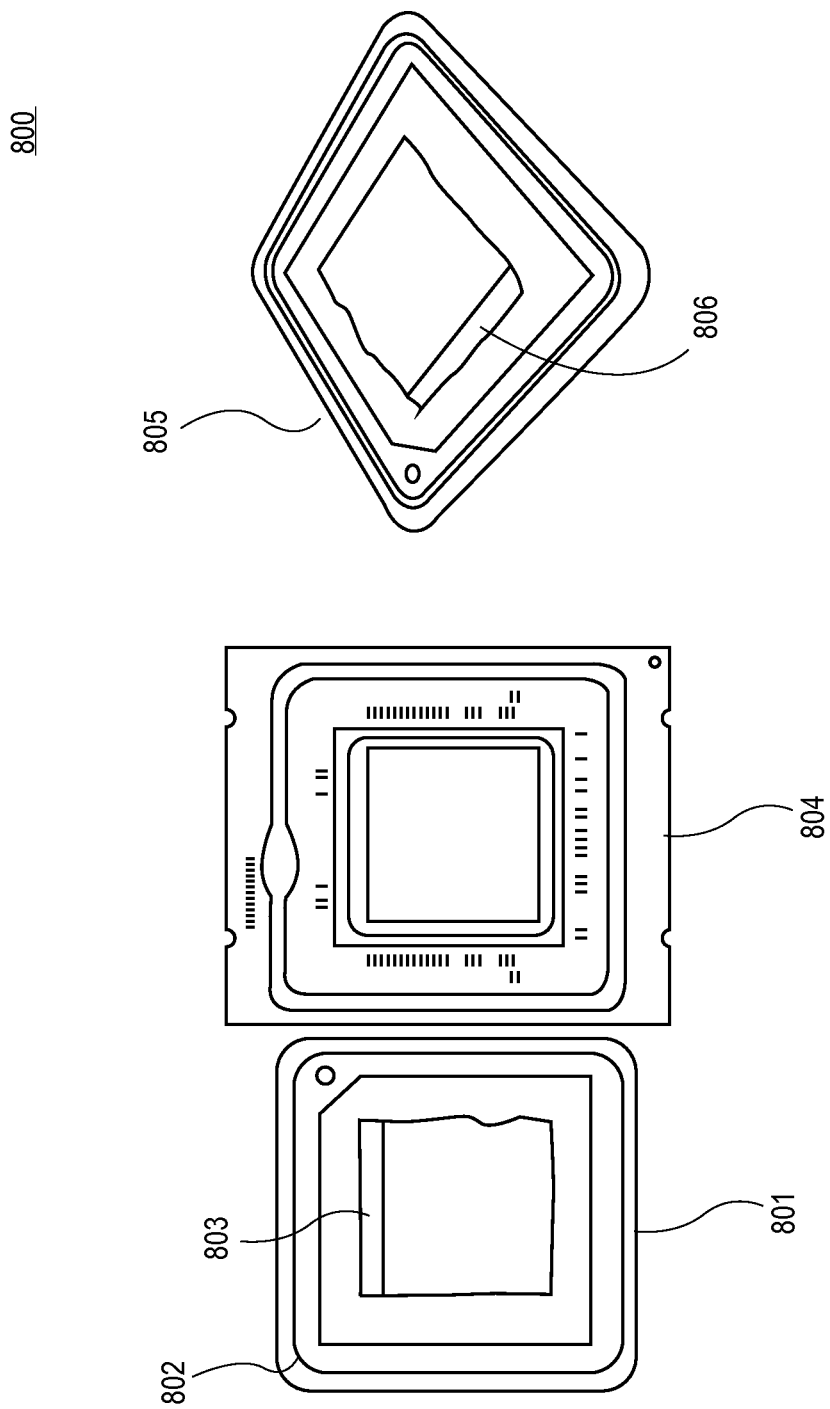
FIG. 8 shows exemplary images of electronic device packaging units as described herein having a lid pulled off after curing according to one embodiment of the invention.

FIG. 7 shows exemplary X-ray images of the electronic device packaging units as described herein after curing to demonstrate efficiency of using the extended preform to control the TIM bleed out according one embodiment. The darker fronts emanating from the location of the die are solder bleed out fronts, such as fronts 711-718. Units 703 and 704 have a typical non-extended STIM preform that matches a die. Units 705-710 have the extended STIM preform, such as a preform 702 that extends beyond a footprint of the die, such as a die 701 (dashed line). Units 705-706 have the STIM preform extension which is about 1 mm, units 707-708 have the STIM preform extension which is about 2 mm, and units 709-710 have the STIM preform extension which is about 2.5 mm. As shown in FIG. 7, the STIM bleed out for units 703 and 704, e.g., a bleed out 711 and a bleed out 712, is not controlled. The STIM bleed out for the units 703 and 704 occurs spontaneously, is non-uniform, has different sizes, and is at different sides of the die. A direction of the STIM bleed out for units 705 and 706 is controlled by the preform extension. As shown in FIG. 7, the direction of the STIM bleed outs 713 and 714, is substantially the same as the direction of the extension. A direction and size of the STIM bleed out for units 707 and 708 are controlled by the preform extension. As shown in FIG. 7, the direction and size of the STIM bleed outs 715 and 716 are substantially the same as the direction and the size of the preform extension. A direction and size of the STIM bleed out for units 709 and 710 are controlled by the preform extension. As shown in FIG. 7, the direction and size of the STIM bleed outs 717 and 718 are substantially the same as the direction and the size of the preform extension. The bleed outs 717 and 718 are uniform. That is, the solder bleed out using the existing preform that matches the die is not directed in one direction and is not controlled. The existing performs spontaneously provide multiple different bleed out directions. In contrast, the extended preform as described herein clearly controls the bleed out parameters (e.g., a direction, and a size). In at least some embodiments, if a size of the preform extension is greater than a threshold, the solder bleed is controlled. In at least some embodiments, the threshold depends on a type of an electronic device package. For example, for the electronic device packages having a die footprint about 20 mm by 30 mm the extension size threshold is from about 1 to 2 mm. In at least some embodiments, the size of the final solder bleed (after reflow) is substantially the same as the size of the initial extension of the preform, if the initial extension is greater than a threshold. For example, for the electronic device packages having a die footprint about 20 mm by 30 mm, the size of the solder bleed out is substantially equal to the size of the initial extension of the preform, if the initial extension is greater than 1 mm FIG. 8 shows exemplary images 800 of electronic device packaging units as described herein having a lid pulled off after curing according to one embodiment of the invention. An image 801 shows a lid/integrated heat spreader 802 pulled off a die on a substrate 804. As shown on image 801, a final solder bleed out front 803 is extended a single direction. An image 805 is another view of the lid/HIS showing a solder bleed out front 806. Images 801 and 805 confirm that after curing the die is completely and uniformly covered by the extended solder TIM and the final solder bleed front is extended in a single direction. Images 801 and 805 do not show incomplete die coverage by the STIM.

Figure 9:
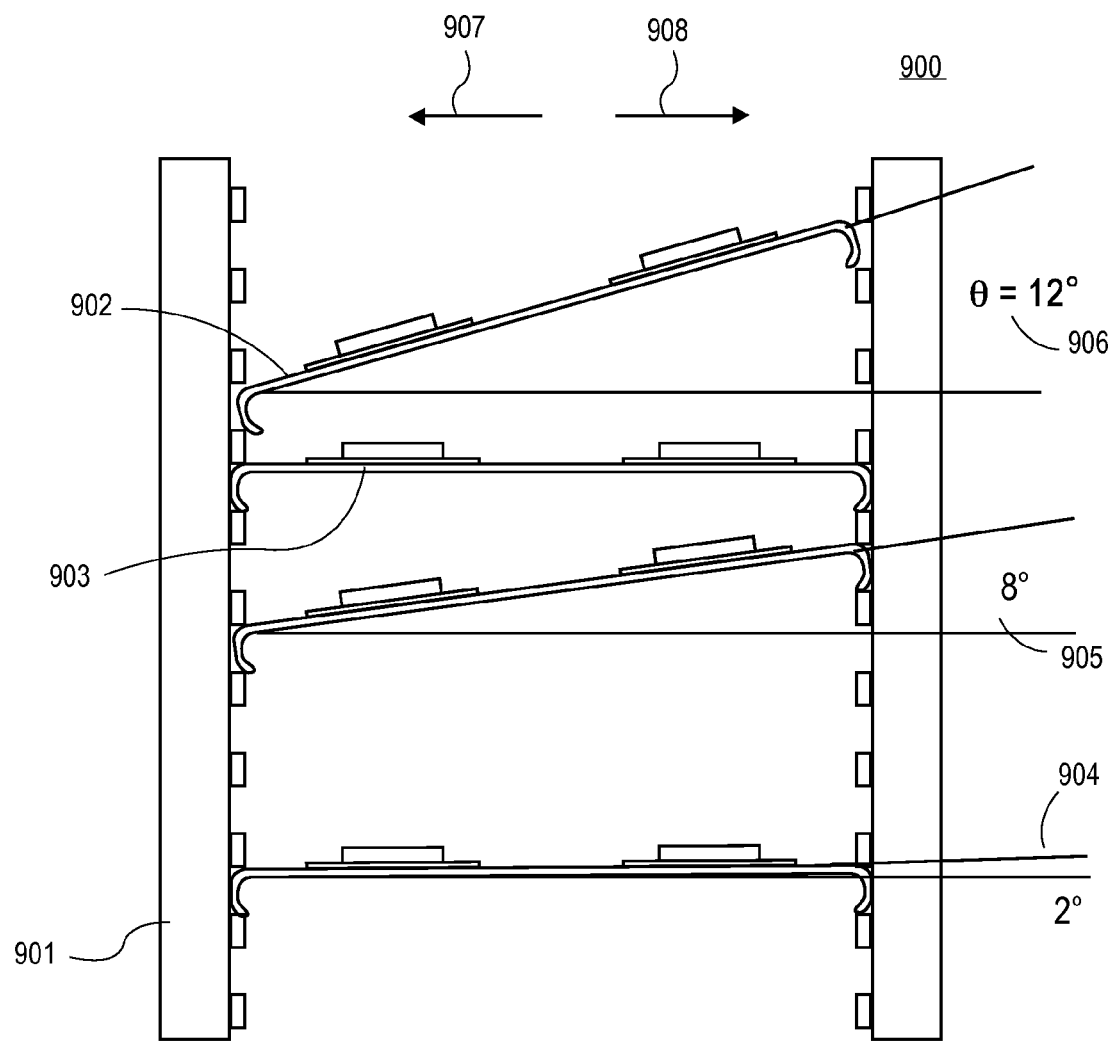
FIG. 9 shows an exemplary experimental setup to demonstrate robustness of controlling a STIM bleed out by an extended preform according to one embodiment of the invention.

FIG. 9 shows an exemplary experimental setup 900 to demonstrate robustness of controlling a STIM bleed out by an extended preform according to one embodiment of the invention. To further demonstrate the robustness of providing an extended preform to control a TIM bleed out, an experiment was conducted to determine if the embodiments involving the extended preform as described herein overcome another solder bleed out modulator, such as a tilt. As shown in FIG. 9, electronic device packages having an extended preform and non-extended preform as described herein, such as an electronic package 902 were placed on support carriers, such as a support carrier 903 in a curing chamber 901 at three different angles, such as an angle 904 (about 2°), an angle 905 (about 8°), and an angle 906 (about 12°). As shown in FIG. 9, tilt drives the solder bleed out in a direction, such as a direction 907 opposing the direction of the extended preform, such as a direction 908. It should be noted that 8° and 12° substantially exceed any nominal process tilt; however, these tilts used to exaggerate any process noises and demonstrate robustness of the extended preform solution.

Figure 10:
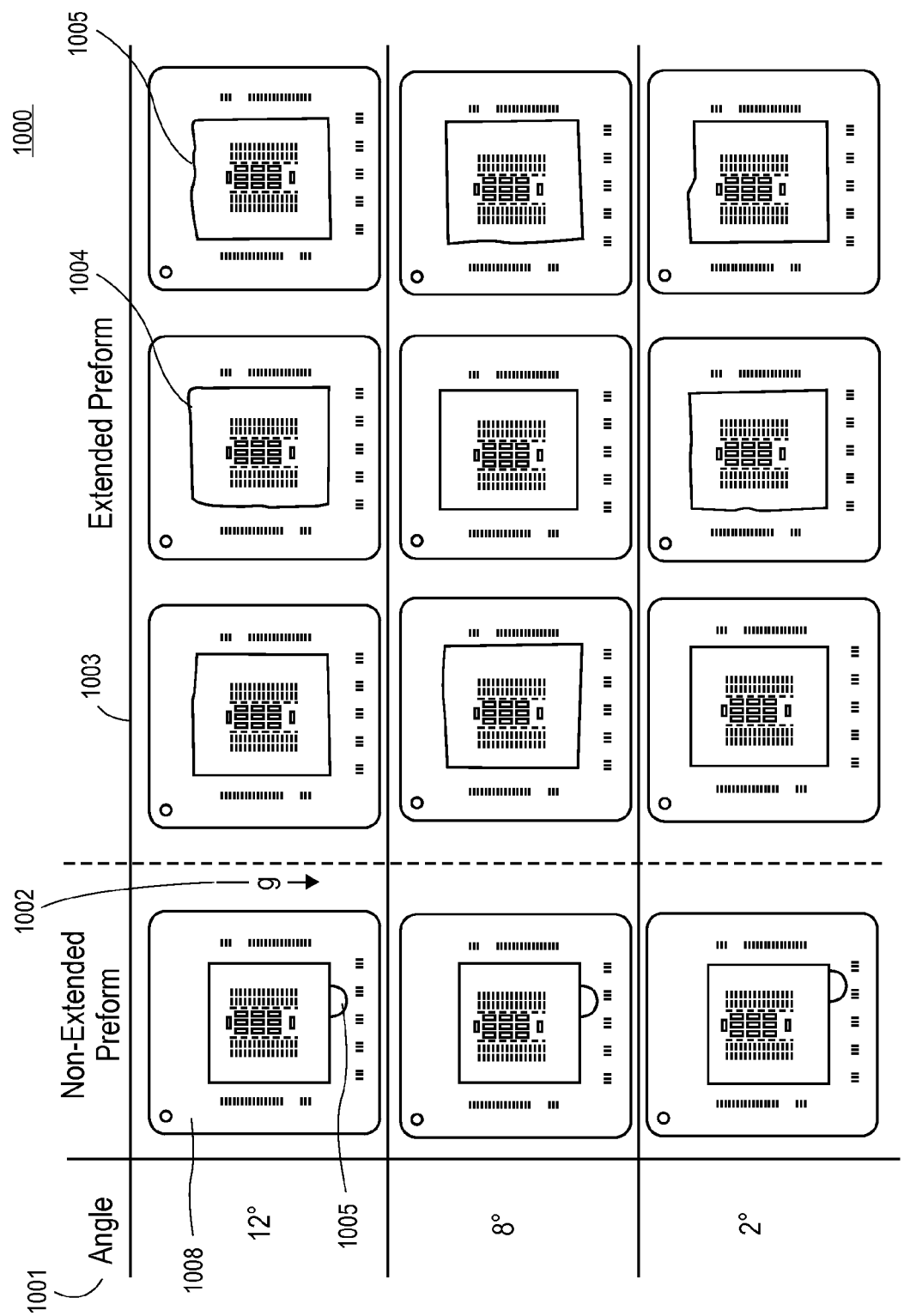
FIG. 10 shows exemplary X ray images of electronic device packaging units placed at different angles in a curing chamber after curing according to one embodiment of the invention.

FIG. 10 shows exemplary X ray images 1000 of electronic device packaging units placed at different angles 1001 in a curing chamber as described above after curing to demonstrate robustness of controlling a STIM bleed out by extended preform according to one embodiment of the invention. The darker fronts emanating from the location of the die are solder bleed out fronts, such as a bleed out front 1006, and a bleed out front 1007. As shown in FIG. 10, for the units having a typical non-extended STIM preform that matches a die, such as a unit 1008, the post cure bleed out fronts, such as a bleed out front 1006, are controlled by a direction of a tilt induced gravity force 1002. That is, the units with non-extended preform have the STIM bleed outs in the direction of the tilt. As shown in FIG. 10, the units having the extended preform from 1 mm to 3 mm, such as a unit 1003 and a unit 1005 have the STIM bleed outs, such as a bleed out 1007 and a bleed out 1004 in the direction of the extension, overcoming the bias induced by tilt. Any unevenness in the solder bleed out front is attributed to the lack of a uniform preform edge (cut using scissors). As the experiments show, after curing all electronic device packages with extended preform as described herein have the STIM bleed out in the direction controlled by the extended preform that overcomes other bleed out modulators, such as tilt. The results of these experiments clearly demonstrate the efficacy and robustness of the extended preform solution, even in the face of extreme bias.

Embodiments described herein provide an advantage of eliminating of the additional processing operation involving the inner sealant bead thereby increasing manufacturing throughput significantly. In at least some embodiments, controlling a TIM bleed out in a predictable manner by the extended preform as described herein increases electronic device manufacturing throughput by as much as 40%. Further, an advantage of the embodiments described herein is that manufacturing of the extended preforms to control STIM bleed does not require any additional equipment. The existing preform manufacturing equipment can be used to fabricate an extended preform described herein. Further, controlling a TIM bleed out in a predictable manner by the extended preform as described herein allows for a decrease in the Keep Out Zone (KOZ) specification.

Figure 12:
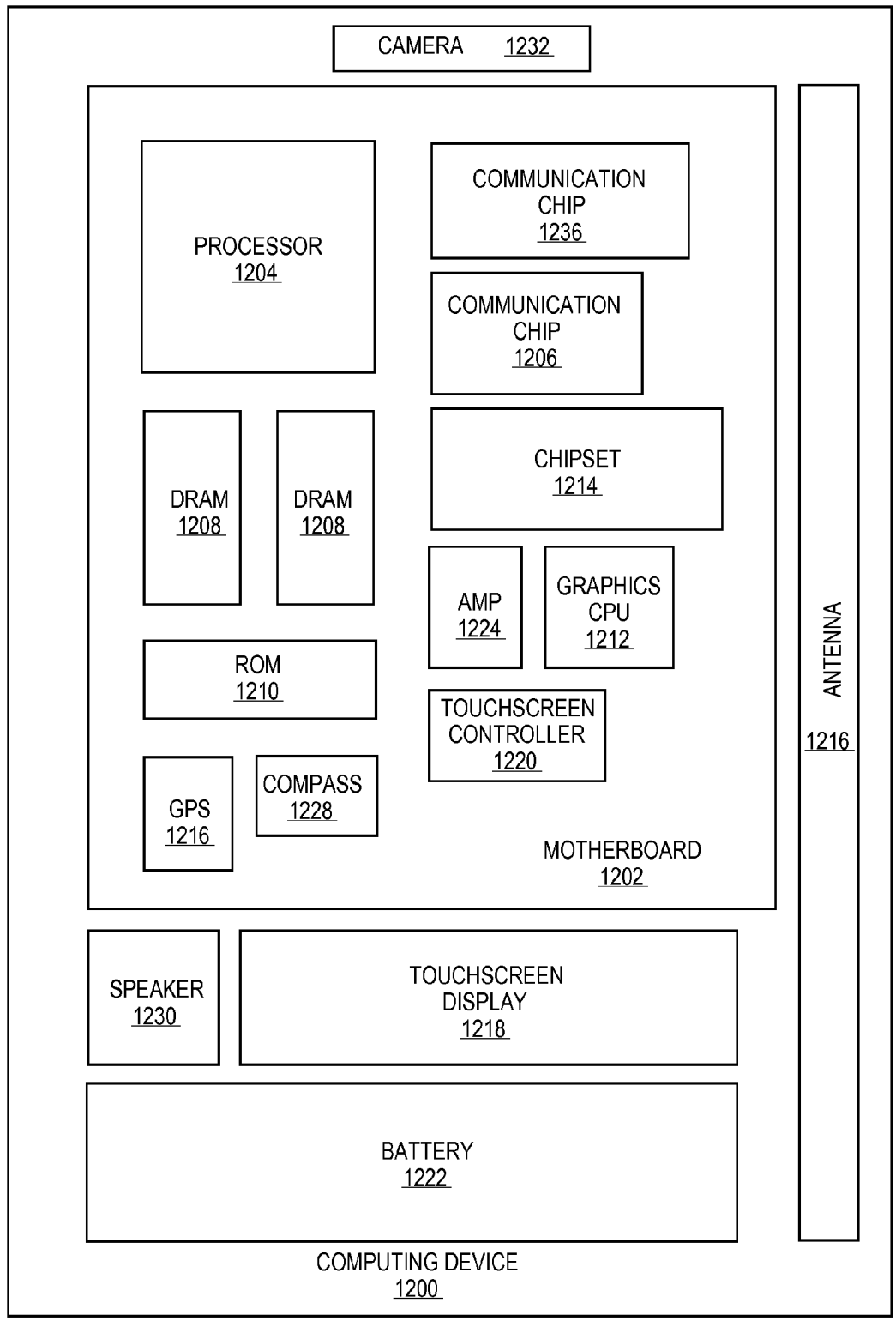
FIG. 12 illustrates a computing device in accordance with one embodiment of the invention.

FIG. 12 illustrates a computing device 1200 in accordance with one embodiment of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip is also physically and electrically coupled to the board 1202. In further implementations, at least one communication chip 1206 is part of the processor 1204.

Depending on its application, computing device 1200 may include other components that may or may not be physically and electrically coupled to the board 1202. These other components include, but are not limited to, a memory, such as a volatile memory 1208 (e.g., a DRAM), a non-volatile memory 1210 (e.g., ROM), a flash memory, a graphics processor 1212, a digital signal processor (not shown), a crypto processor (not shown), a chipset 1214, an antenna 1216, a display, e.g., a touchscreen display 1218, a display controller, e.g., a touchscreen controller 1220, a battery 1222, an audio codec (not shown), a video codec (not shown), an amplifier, e.g., a power amplifier 1224, a global positioning system (GPS) device 1226, a compass 1228, an accelerometer (not shown), a gyroscope (not shown), a speaker 1230, a camera 1232, and a mass storage device (such as hard disk drive, compact disk (CD), digital versatile disk (DVD), and so forth) (not shown).

A communication chip, e.g., communication chip 1206, enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips. For instance, a communication chip 1206 may be dedicated to shorter range wireless communications such as Wi-Fi and Bluetooth and a communication chip 1236 may be dedicated to longer range wireless communications such as GPS, EDGE, GPRS, CDMA, WiMAX, LTE, Ev-DO, and others.

In at least some embodiments, the processor 1204 of the computing device 1200 includes an integrated circuit die packaged within the processor 1004 packaged using the extended preform to control solder thermal interface bleed out as described herein. The integrated circuit die of the processor includes one or more devices, such as transistors or metal interconnects as described herein. The term "processor" may refer to any device or portion of a device that processes electronic data from registers and/or memory to transform that electronic data into other electronic data that may be stored in registers and/or memory.

The communication chip 1006 also includes an integrated circuit die package having the extended preform to control solder thermal interface material bleed out according to the embodiments described herein.

In further implementations, another component housed within the computing device 1000 may contain an integrated circuit die package having the extended preform to control solder thermal interface material bleed out according to embodiments described herein.

In accordance with one implementation of the invention, the integrated circuit die of the communication chip includes one or more devices, such as transistors and metal interconnects, as described herein. In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The following examples pertain to further embodiments:

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing.

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing; and controlling a direction of the bleed out by adjusting a direction of the extension.

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing; and controlling a size of the bleed out by adjusting a size of the extension.

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing, wherein the extension induces a force to control the bleed out.

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing, wherein the TIM is a metal based TIM.

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing; and determining a direction of the extension based on a keep out zone between the die and die side components on the substrate.

A method to manufacture an integrated circuit device, comprising depositing a preform of a thermal interface material (TIM) on a die on a substrate, wherein the preform has an extension beyond a footprint of the die; depositing a heat spreader on the preform, curing the preform; and controlling a bleed out of the TIM by the extension during the curing; and, wherein the die comprises a processor, a memory, any other stacked and non-stacked electronic components, or a combination thereof.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein a direction of the extension controls a direction of the bleed out.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein a size of the extension controls a size of the bleed out.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein the extended preform induces a force to control the bleed out.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein the TIM is a metal based TIM.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein the extension is greater than 1 millimeter (mm).

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein a direction of the extension is determined by a keep out zone between the die and die side components on the substrate.

An integrated circuit device, comprising a die on a substrate; a preform of a thermal interface material (TIM) on the die; and a heat spreader on the preform, wherein the preform has an extension beyond a footprint of the die, wherein the extension is configured to control a bleed out of the TIM upon curing the preform, and wherein the die comprises a processor, a memory, any other stacked and non-stacked electronic components, or a combination thereof.

A method to control a thermal interface material (TIM) bleed out, comprising:
 forming an extended preform of the TIM to be placed on a die and cured at an assembly process, wherein the preform has an extension beyond a footprint of the die in a first direction to control a bleed out direction of the TIM upon curing the preform.

A method to control a thermal interface material (TIM) bleed out, comprising:
 forming an extended preform of the TIM to be placed on a die and cured at an assembly process, wherein the preform has an extension beyond a footprint of the die in a first direction to control a bleed out direction of the TIM upon curing the preform, and controlling the bleed out direction by adjusting the first direction.

A method to control a thermal interface material (TIM) bleed out, comprising:
 forming an extended preform of the TIM to be placed on a die and cured at an assembly process, wherein the preform has an extension beyond a footprint of the die in a first direction to control a bleed out direction of the TIM upon curing the preform, and controlling a bleed out size of the TIM by adjusting a size of the extension.

A method to control a thermal interface material (TIM) bleed out, comprising:

forming an extended preform of the TIM to be placed on a die and cured at an assembly process, wherein the preform has an extension beyond a footprint of the die in a first direction to control a bleed out direction of the TIM upon curing the preform, wherein the forming includes stamping the TIM to have a size larger than a size of the die along the first direction.

A method to control a thermal interface material (TIM) bleed out, comprising:

forming an extended preform of the TIM to be placed on a die and cured at an assembly process, wherein the preform has an extension beyond a footprint of the die in a first direction to control a bleed out direction of the TIM upon curing the preform; determining a largest keep out zone between the die and the die side components; and determining the first direction based on the largest keep out zone.

A method to control a thermal interface material (TIM) bleed out, comprising:

forming an extended preform of the TIM to be placed on a die and cured at an assembly process, wherein the preform has an extension beyond a footprint of the die in a first direction to control a bleed out direction of the TIM upon curing the preform, wherein the TIM is a metal based TIM.

Specifics in the examples may be used anywhere in one or more embodiments.

In the foregoing specification, embodiments of the invention have been described with reference to specific exemplary embodiments thereof. It will be evident that various modifications may be made thereto without departing from the broader embodiments of the invention as set forth in the following claims. The specification and drawings are, accordingly, to be regarded in an illustrative sense rather than a restrictive sense.

What is claimed is:

1. A method to manufacture an integrated circuit device, comprising:
    depositing a preform of a thermal interface material (TIM) on a die on a substrate, wherein the preform has an extension beyond a footprint of the die;
    depositing a heat spreader on the preform,
    curing the preform; and
    controlling a bleed out of the TIM by the extension during the curing.

2. The method of claim 1, further comprising controlling a direction of the bleed out by adjusting a direction of the extension.

3. The method of claim 1, further comprising controlling a size of the bleed out by adjusting a size of the extension.

4. The method of claim 1, wherein the extension induces a force to control the bleed out.

5. The method of claim 1, wherein the TIM is a metal based TIM.

6. The method of claim 1, further comprising determining a direction of the extension based on a keep out zone between the die and die side components on the substrate.

7. The method of claim 1, wherein the die comprises a processor, a memory, any other stacked and non-stacked electronic components, or a combination thereof.

8. An integrated circuit device, comprising:
    a die on a substrate;
    a preform of a thermal interface material (TIM) on the die; and
    a heat spreader on the preform, wherein the preform has an extension in a single direction beyond a footprint of the die, wherein the extension is configured to control a bleed out of the TIM upon curing the preform.

9. The integrated circuit device of claim 8, wherein a direction of the extension controls a direction of the bleed out.

10. The integrated circuit device of claim 8, wherein a size of the extension controls a size of the bleed out.

11. The integrated circuit device of claim 8, wherein the extended preform induces a force to control the bleed out.

12. The integrated circuit device of claim 8, wherein the TIM is a metal based TIM.

13. The integrated circuit device of claim 8, wherein the extension is greater than 1 millimeter (mm).

14. The integrated circuit device of claim 8, wherein a direction of the extension is determined by a keep out zone between the die and die side components on the substrate.

15. The integrated circuit device of claim 8, wherein the die comprises a processor, a memory, any other stacked and non-stacked electronic components, or a combination thereof.

16. A method to control a thermal interface material (TIM) bleed out, comprising:
    forming an extended preform of the TIM to be placed on a die and cured at an assembly process, wherein the preform has an extension that extends beyond a footprint of the die in a single direction to control a bleed out direction of the TIM upon curing the preform.

17. The method of claim 16, further comprising
    controlling the bleed out direction by adjusting the direction of the extension.

18. The method of claim 16, further comprising
    controlling a bleed out size of the TIM by adjusting a size of the extension.

19. The method of claim 16, wherein the forming includes stamping the TIM to have a size larger than a size of the die along the direction of the extension.

20. The method of claim 16, further comprising
    determining a largest keep out zone between the die and the die side components;
    determining the direction of the extension based on the largest keep out zone.

21. The method of claim 16, wherein the TIM is a metal based TIM.

* * * * *